(12) United States Patent
Halley

(10) Patent No.: US 6,495,463 B2
(45) Date of Patent: *Dec. 17, 2002

(54) METHOD FOR CHEMICAL MECHANICAL POLISHING

(75) Inventor: David G. Halley, Los Osos, CA (US)

(73) Assignee: Strasbaugh, San Luis Obispo, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/407,472

(22) Filed: Sep. 28, 1999

(65) Prior Publication Data

US 2002/0068450 A1 Jun. 6, 2002

(51) Int. Cl.[7] .............................................. H01L 21/302
(52) U.S. Cl. ....................... 438/690; 438/691; 438/692; 438/693
(58) Field of Search ................................ 438/690, 691, 438/692, 693; 451/278, 287, 292; 156/345

(56) References Cited

U.S. PATENT DOCUMENTS

| 5,599,423 A | * | 2/1997 | Parker et al. ................ 156/345 |
| 5,664,987 A | * | 9/1997 | Renteln ........................ 451/21 |
| 5,792,709 A | * | 8/1998 | Robinson et al. ............ 438/692 |
| 5,931,722 A | * | 8/1999 | Ohmi et al. ................. 451/271 |
| 5,938,504 A | * | 8/1999 | Talieh .......................... 451/11 |
| 6,004,187 A | * | 12/1999 | Nyui et al. ..................... 451/5 |
| 6,022,807 A |   | 2/2000 | Lindsey, Jr. et al. ......... 438/693 |

* cited by examiner

Primary Examiner—Felisa Hiteshew
Assistant Examiner—Lan Vinh
(74) Attorney, Agent, or Firm—Townsend and Townsend and Crew LLP

(57) ABSTRACT

A method of polishing semiconductor wafers. The method includes spacing the polishing pad from the center of the wafer by a selected offset distance (406) and translating the polishing pad in a manner wherein the translation speed varies as the pad is moved across the surface of the wafer (414). A method (FIGS. 7 and 9) for calibrating a polishing apparatus includes iteratively selecting an offset distance, performing a polish, inspecting the resulting removal profile, and repeating until a desired characteristic (FIG. 6C) in the removal profile is attained.

17 Claims, 7 Drawing Sheets

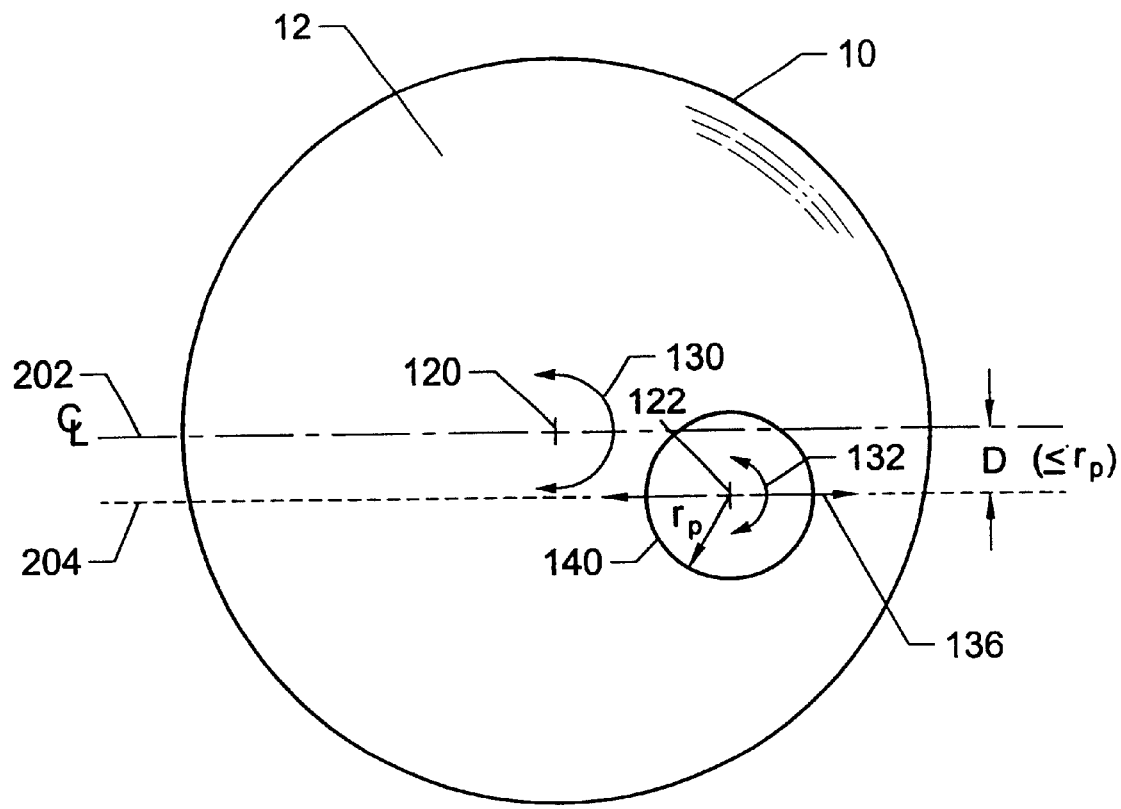
FIG. 2
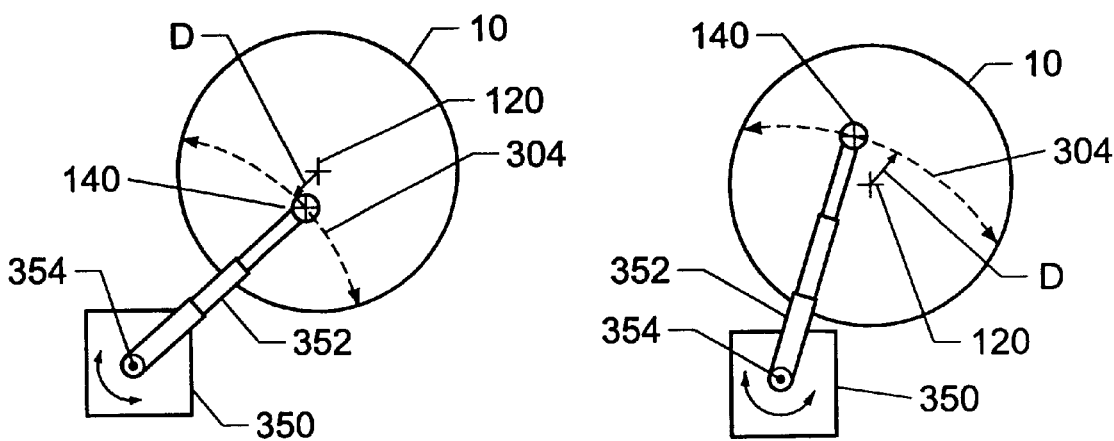
FIG. 3A
FIG. 3B

METHOD FOR CHEMICAL MECHANICAL POLISHING

CROSS-REFERENCES TO RELATED APPLICATIONS

This application is related to co-pending U.S. application Ser. No. 09/432,144, filed Nov. 2, 1999, entitled "Method and Apparatus for Chemical Mechanical Polishing," both of which are commonly owned by the Assignee of the present application, the entire contents of which is incorporated herein by reference.

BACKGROUND OF THE INVENTION

The present invention relates to the manufacture of electronic devices. More particularly, the invention provides a technique including a method and device for planarizing a film of material of an article such as a semiconductor wafer. However, it will be recognized that the invention has a wider range of applicability; it can also be applied to flat panel displays, hard disks, raw wafers, and other objects that require a high degree of planarity.

The fabrication of integrated circuit devices often begins by producing semiconductor wafers cut from an ingot of single crystal silicon which is formed by pulling a seed from a silicon melt rotating in a crucible. The ingot is then sliced into individual wafers using a diamond cutting blade. Following the cutting operation, at least one surface (process surface) of the wafer is polished to a relatively flat, scratch-free surface. The polished surface area of the wafer is first subdivided into a plurality of die locations at which integrated circuits (IC) are subsequently formed. A series of wafer masking and processing steps are used to fabricate each IC. Thereafter, the individual dice are cut or scribed from the wafer and individually packaged and tested to complete the device manufacture process.

During IC manufacturing, the various masking and processing steps typically result in the formation of topographical irregularities on the wafer surface. For example, topographical surface irregularities are created after metallization, which includes a sequence of blanketing the wafer surface with a conductive metal layer and then etching away unwanted portions of the blanket metal layer to form a metallization interconnect pattern on each IC. This problem is exacerbated by the use of multilevel interconnects.

A common surface irregularity in a semiconductor wafer is known as a step. A step is the resulting height differential between the metal interconnect and the wafer surface where the metal has been removed. A typical VLSI chip on which a first metallization layer has been defined may contain several million steps, and the whole wafer may contain several hundred ICs.

Consequently, maintaining wafer surface planarity during fabrication is important. Photolithographic processes are typically pushed close to the limit of resolution in order to create maximum circuit density. Typical device geometries call for line widths on the order of 0.5 $\mu$M. Since these geometries are photolithographically produced, it is important that the wafer surface be highly planar in order to accurately focus the illumination radiation at a single plane of focus to achieve precise imaging over the entire surface of the wafer. A wafer surface that is not sufficiently planar, will result in structures that are poorly defined, with the circuits either being nonfunctional or, at best, exhibiting less than optimum performance. To alleviate these problems, the wafer is "planarized" at various points in the process to minimize non-planar topography and its adverse effects. As additional levels are added to multilevel-interconnection schemes and circuit features are scaled to submicron dimensions, the required degree of planarization increases. As circuit dimensions are reduced, interconnect levels must be globally planarized to produce a reliable, high density device. Planarization can be implemented in either the conductor or the dielectric layers.

In order to achieve the degree of planarity required to produce high density integrated circuits, chemical-mechanical planarization processes ("CMP") are being employed with increasing frequency. A conventional rotational CMP apparatus includes a wafer carrier for holding a semiconductor wafer. A soft, resilient pad is typically placed between the wafer carrier and the wafer, and the wafer is generally held against the resilient pad by a partial vacuum. The wafer carrier is designed to be continuously rotated by a drive motor. In addition, the wafer carrier typically is also designed for transverse movement. The rotational and transverse movement is intended to reduce variability in material removal rates over the surface of the wafer. The apparatus further includes a rotating platen on which is mounted a polishing pad. The platen is relatively large in comparison to the wafer, so that during the CMP process, the wafer may be moved across the surface of the polishing pad by the wafer carrier. A polishing slurry containing chemically-reactive solution, in which are suspended abrasive particles, is deposited through a supply tube onto the surface of the polishing pad.

CMP is advantageous because it can be performed in one step, in contrast to past planarization techniques which are complex, involving multiple steps. Moreover, CMP has been demonstrated to maintain high material removal rates of high surface features and low removal rates of low surface features, thus allowing for uniform planarization. CMP can also be used to remove different layers of material and various surface defects. CMP thus can improve the quality and reliability of the ICs formed on the wafer.

Chemical-mechanical polishing is a well developed planarization technique. The underlying chemistry and physics of the method is understood. However, it is commonly accepted that it still remains very difficult to obtain smooth results near the center of the wafer. The result is a planarized wafer whose center region may or may not be suitable for subsequent processing. Sometimes, therefore, it is not possible to fully utilize the entire surface of the wafer. This reduces yield and subsequently increases the per-chip manufacturing cost. Ultimately, the consumer suffers from higher prices.

It is therefore desirable to maximize the useful surface of a semiconductor wafer to increase chip yield. What is needed is an improvement of the CMP technique to improve the degree of global planarity that can be achieved using CMP.

SUMMARY OF THE INVENTION

According to the present invention, a technique for improving chemical mechanical polishing ("CMP") is provided. In an exemplary embodiment, the invention provides a polishing method for providing uniform removal of material from the surface of a substrate.

In accordance with the invention, a method for polishing semiconductor wafers includes selecting a pad offset distance and positioning a polishing pad relative to a wafer on the basis of the pad offset distance. The wafer is then polished by contacting the pad against the wafer and translating the pad across the wafer surface. The pad is translated along a curvlinear path defined by the traversal of the pad axis. The path has a minimum separation distance from the axis of rotation of the wafer substantially equal to the offset distance. The path can be arbitrary, so long as the offset distance is not violated. In a particular embodiment of the invention, the path follows a linear path parallel to a line through the center of the wafer; the linear path being separated from the centerline by the offset distance. During the polish operation, the translational velocity of the pad is varied in accordance with a velocity profile corresponding to the selected offset distance. The wafer and the pad each is rotated in a direction opposite the other.

Further in accordance with the invention, the pad offset distance is determined by selecting a first offset distance. The pad is positioned relative to a test wafer based on this first offset distance. A polish of the test wafer is performed. The pad is translated at a constant velocity across the wafer. A removal profile of the resulting polished test wafer is then produced. Based on the characteristics of the removal profile, a second offset distance is selected and the process is repeated on a second test wafer. The subsequent pad offset distance may be greater than or less than the previous offset distance. When the desired removal profile is achieved, the corresponding offset distance is stored. A velocity profile is then generated based on the shape of the removal profile. Thus, in a subsequent polish of a production wafer, the polishing pad is positioned based on the offset distance and translated across the wafer in accordance with the velocity profile to produce a high quality polish exhibiting global uniform planarity of the wafer surface.

The present invention achieves these benefits in the context of known process technology and known techniques in the mechanical arts. However, a further understanding of the nature and advantages of the present invention may be realized by reference to the latter portions of the specification and attached drawings.

BRIEF DESCRIPTION OF THE DRAWINGS

FIG. 2 is a simplified overhead view showing the surface of a wafer to be polished and a polishing pad according to an embodiment of the present invention.

FIGS. 3A and 3B are simplified overhead views illustrating the general curvlinear nature of the pad traversal paths possible with the present invention.

DESCRIPTION OF THE SPECIFIC EMBODIMENTS

Figure 1A:
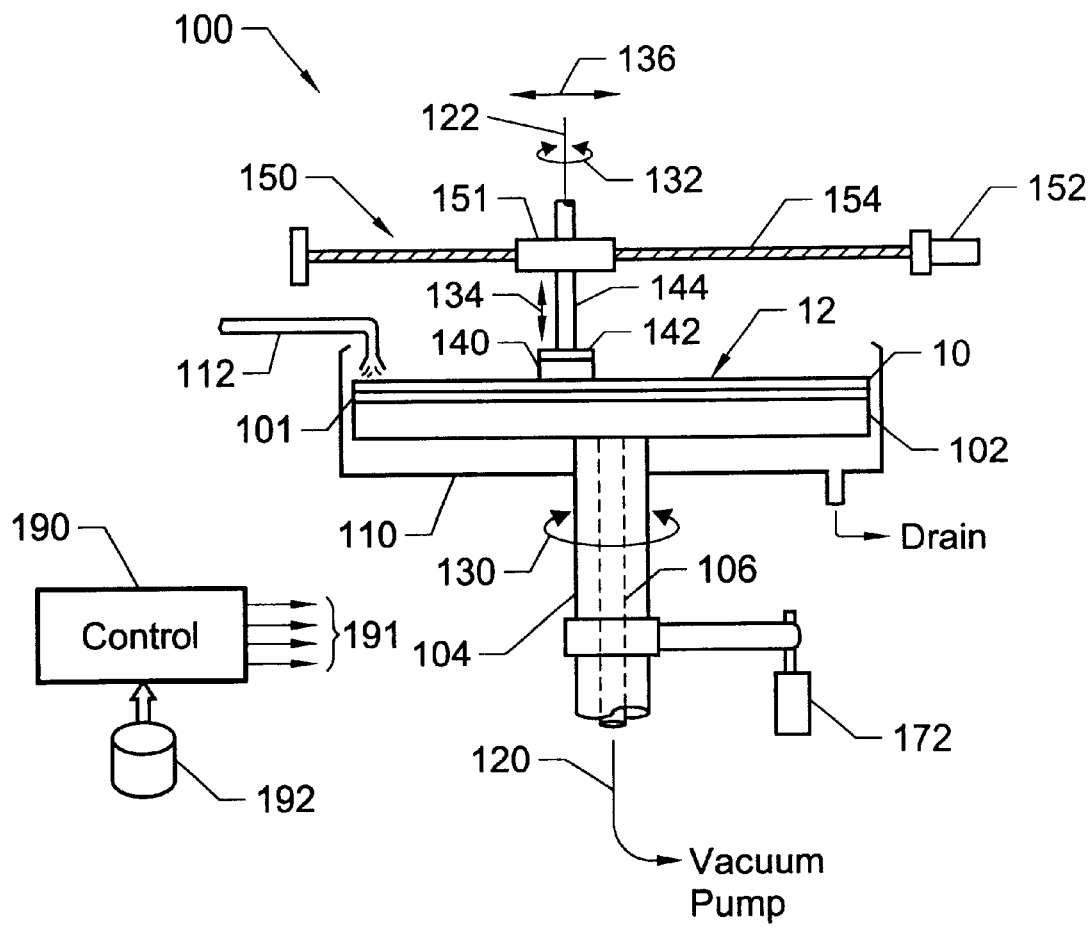
FIG. 1A shows a simplified polishing apparatus in accordance with an embodiment of the present invention.

Referring to FIG. 1A, a chemical-mechanical polishing apparatus 100 according to the invention includes a chuck 102 for holding a wafer 10 in position during a polishing operation. The apparatus shown is merely an example and has been simplified to facilitate a discussion of the salient aspects of the invention. As such, the figure should not unduly limit the scope of the claims herein. One of ordinary skill in the art would recognize many other variations, alternatives, and modifications.

The chuck includes a drive spindle 104 which is coupled to a motor 172 via a drive belt 174 to rotate the wafer about its axis 120. Preferably, the motor is a variable-speed device so that the rotational speed of the wafer can be varied. In addition, the direction of rotation of the motor can be reversed so that the wafer can be spun in either a clockwise direction or a counterclockwise direction. Typically, stepper motors are used since their speed can be easily controlled, as well as their direction of rotation.

A channel 106 formed through spindle 104 is coupled to a vacuum pump (not shown). Chuck 102 may be a porous material, open to ambient at its upper surface so that air drawn in from the surface through channel 106 creates a low pressure region near the surface. A wafer placed on the chuck surface is consequently held in place by the resulting vacuum created between the wafer and the chuck. Alternatively, chuck 102 may be a solid material having numerous channels formed through the upper surface, each having a path to channel 106, again with the result that a wafer placed atop the chuck will be held in position by a vacuum. Such vacuum-type chucks are known and any of a variety of designs can be used with the invention. In fact, mechanical clamp chucks can be used. However, these types are less desirable because the delicate surfaces of the wafer to be polished can be easily damaged by the clamping mechanism. In general, any equivalent method for securing the wafer in a stationary position and allowing the wafer to be rotated would be equally effective for practicing the invention.

A wafer backing film 101 is disposed atop the surface of chuck 102. The backing film is a polyurethane material. The material provides compliant support structure which is typically required when polishing a wafer. High spots on a wafer prevent the pad from contacting the thinner areas (low spots) of the wafer. The compliant backing material permits the wafer to deflect enough to flatten its face against the polish pad. There can be a deflection of several thousands of an inch deflection under standard polishing forces. Polyurethane is not necessary, however, as any appropriate compliant support material will work equally well in this invention.

FIG. 1A also shows a polishing pad assembly comprising a polishing pad 140, a chuck 142 for securing the pad in position, and a pad spindle 144 coupled to the chuck for rotation of the pad about its axis 122. In accordance with the invention, the pad diameter is less than the diameter of wafer 10, typically 20% of the wafer diameter. A drive motor (not shown) is coupled to pad spindle 144 to provide rotation of the pad. Preferably, the drive motor is a variable-speed device so that the rotational speed of pad 140 during a particular polishing operation can be controlled. The drive motor preferably is reversible.

Figure 1B:
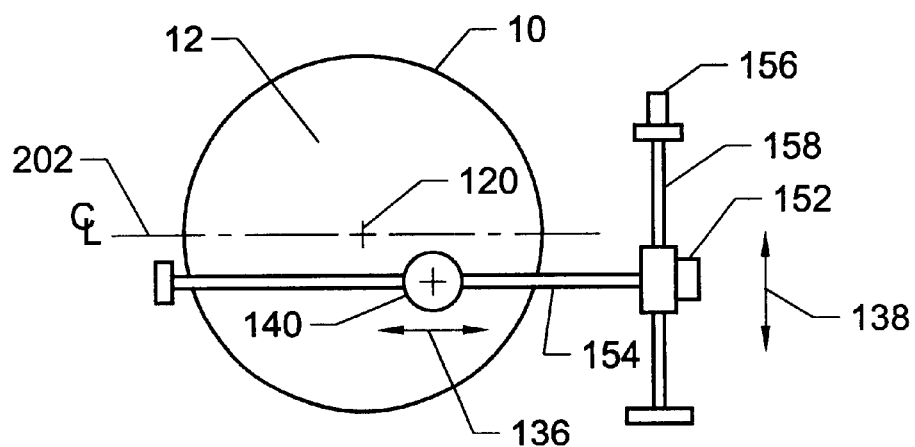
FIG. 1B is a simplified overhead view of the arrangement of an x-y translation stage in relation to a wafer to be polished.
Figure 4:
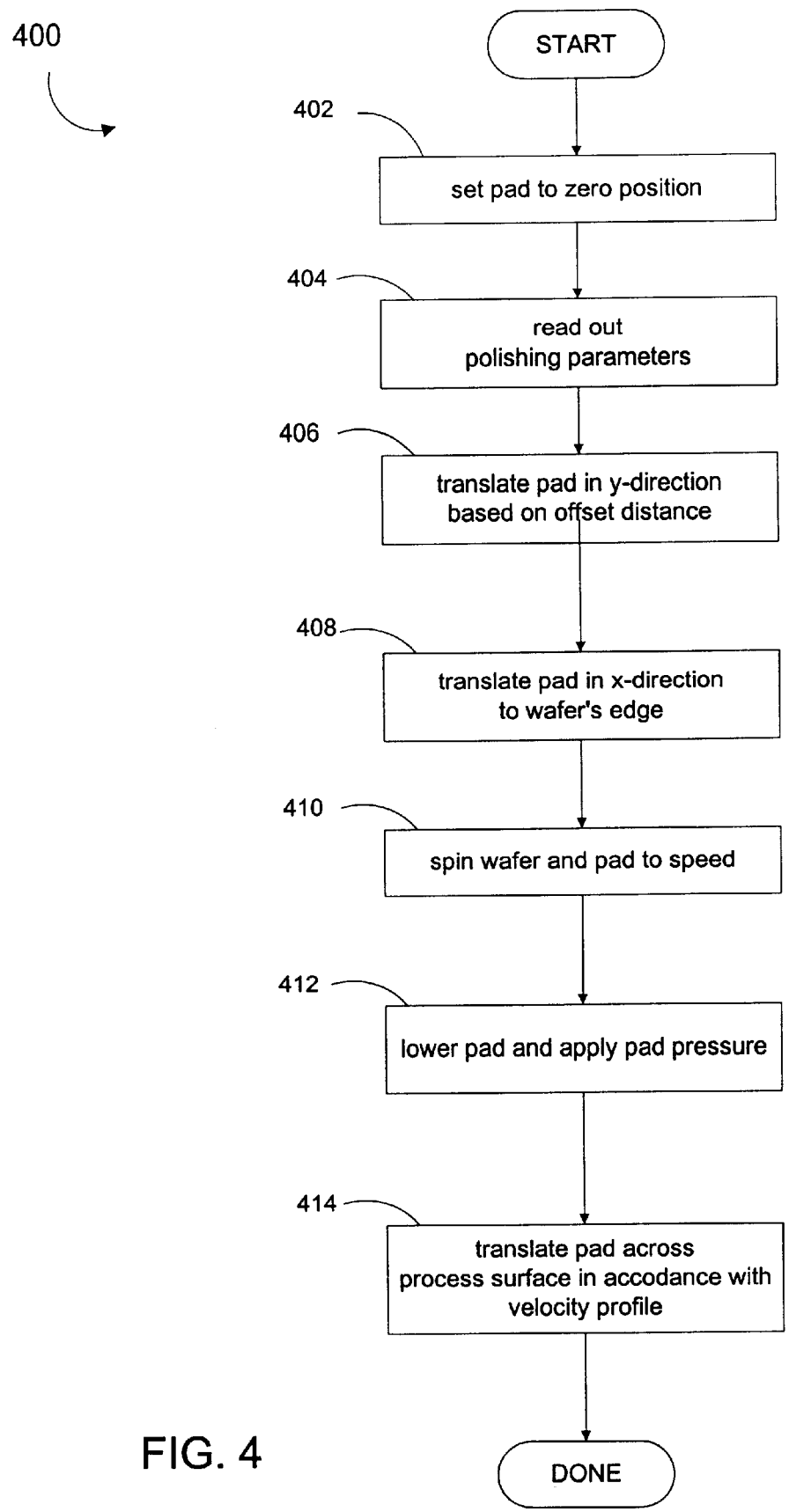
FIG. 4 is a summary of the general steps of a polishing operation performed in accordance with the invention.

Referring to FIGS. 1A and 1B, a traverse mechanism 150 provides translational displacement of the polishing pad assembly across the wafer surface. In one embodiment of the invention, the traverse mechanism is an x-y translation stage that includes a platform 151 for carrying the pad assembly. The traverse mechanism 150 further includes drive screws 154 and 158, each respectively driven by motors 152 and 156 to move platform 151. Motors 152 and 156 respectively translate platform 151 in the x-direction, indicated by reference numeral 136, and in the y-direction, indicated by reference numeral 138. Motors 152 and 156 preferably are variable-speed devices so that the translation speed can be controlled during polishing. Stepper motors are typically used to provide high accuracy translation and repeatability.

It is noted that the function of traverse mechanism 150 can be provided by other known translation mechanisms as alternatives to the aforementioned x-y translation stage. Alternative mechanisms include pulley-driven devices and pneumatically operated mechanisms. The present invention would be equally effective regardless of the particular mechanical implementation selected for the translation mechanism.

Continuing with FIG. 1A, the pad 140 is oriented relative to wafer 10 such that process surface 12 of the wafer is substantially horizontal and faces upwardly. The polishing surface of pad 140 is lowered onto process surface 12 of the wafer. This arrangement of wafer surface to pad surface is preferred. If a power failure occurs, the various components in the CMP apparatus will likely cease to operate. In particular, the vacuum system is likely to stop functioning. Consequently, wafer 10 will no longer be held securely in place by vacuum chuck 102. However, since the wafer is already in a neutral position, the wafer will not fall and become damaged when the chuck loses vacuum but will simply rest upon the chuck.

The pad assembly is arranged on the translation stage of traverse mechanism 150 to allow for motion in the vertical direction which is indicated in FIG. 1A by reference numeral 134. This allows for lowering the pad onto the wafer surface for the polishing operation. Preferably, the pad assembly is driven by an actuator (e.g., a piston-driven mechanism) having variable-force control in order to control the downward pressure of the pad upon the wafer surface. The actuator is typically equipped with a force transducer to provide a downforce measurement which can be readily converted to a pad pressure reading. Numerous pressure-sensing actuator designs, known in the relevant engineering arts, can be used.

A slurry delivery mechanism 112 is provided to dispense a polishing slurry onto process surface 12 of wafer 10 during a polishing operation. Although FIG. 1A shows a single dispenser 122, additional dispensers may be provided depending on the polishing requirements of the wafer. Polishing slurries are known in the art. For example, typical slurries include a mixture of colloidal silica or dispersed alumina in an alkaline solution such as KOH, $NH_4OH$ or $CeO_2$. Alternatively, slurry-less pad systems can be used.

A splash shield 110 is provided to catch the polishing fluids and to protect the surrounding equipment from the caustic properties of any slurries that might be used during polishing. The shield material can be polypropylene or stainless steel, or some other stable compound that is resistant to the corrosive nature of polishing fluids.

A controller 190 in communication with a data store 192 issues various control signals 191 to the foregoing-described components of polishing apparatus 100. The controller provides the sequencing control and manipulation signals to the mechanics to effectuate a polishing operation. The data store 192 preferably is externally accessible. This permits user-supplied data to be loaded into the data store to provide polishing apparatus 100 with the parameters for performing a polishing operation. This aspect of the preferred embodiment will be further discussed below.

Any of a variety of controller configurations are contemplated for the present invention. The particular configuration will depend on considerations such as throughput requirements, available footprint for the apparatus, system features other than those specific to the invention, implementation costs, and the like. In one embodiment, controller 190 is a personal computer loaded with control software. The personal computer includes various interface circuits to each component of polishing apparatus 100. The control software communicates with these components via the interface circuits to control apparatus 100 during a polishing operation. In this embodiment, data store 192 can be an internal hard drive containing desired polishing parameters. User-supplied parameters can be keyed in manually via a keyboard (not shown). Alternatively, data store 192 is a floppy drive in which case the parameters can be determined elsewhere, stored on a floppy disk, and carried over to the personal computer. In yet another alternative, data store 192 is a remote disk server accessed over a local area network. In still yet another alternative, the data store is a remote computer accessed over the Internet; for example, by way of the world wide web, via an FTP (file transfer protocol) site, and so on.

In another embodiment, controller 190 includes one or more microcontrollers which cooperate to perform a polishing sequence in accordance with the invention. Data store 192 serves as a source of externally-provided data to the microcontrollers so they can perform the polish in accordance with user-supplied polishing parameters. It should be apparent that numerous configurations for providing user-supplied polishing parameters are possible. Similarly, it should be clear that numerous approaches for controlling the constituent components of the CMP are possible.

FIG. 2 is an overhead view showing the arrangement of polishing pad 140 relative to process surface 12 of wafer 10. In accordance with the invention, the radial measure $r_p$ of pad 140 is smaller than the radial measure of wafer 10. As previously indicated, $r_p$ is typically 20% of the radius of wafer 10 although the pad can be smaller, or larger. The axis of rotation 120 of wafer 10 has an associated center line 202 passing through the axis. As indicated in FIG. 2, the direction of rotation 130 of wafer 10 can be in the clockwise or counterclockwise direction.

During polishing, pad 140 is translated by traverse mechanism 150 along a path 204 that is substantially parallel to centerline 202. Traversal path 204 is defined by the path of the axis of rotation 122 of pad 140. The separation distance D between centerline 202 and traversal path 204 is referred to as the "pad offset distance." More specifically, the "pad offset distance" is the minimum radial distance of the axis of rotation of the pad 140 from the axis of rotation 120 of a wafer 10. With respect to FIG. 2, the offset distance also happens to be the perpendicular distance between centerline 202 and path 204 since the centerline is parallel to the linear traversal path. The polishing pad 140 rotates about its axis 122 in either the clockwise or the counterclockwise direction which is identified by reference numeral 132.

FIGS. 3A and 3B further illustrate the meaning of the "pad offset distance." Recall that the offset distance is defined with respect to the pad traversal path 304 and the axis of rotation 120 of the wafer. The pad traversal path is defined with respect to the axis of rotation of the pad. FIGS. 3A and 3B show that the pad traversal path need not be strictly linear as shown in FIG. 2. Instead, the path can be arcuate, and in general can be any curvlinear shape. In the most general case, the traversal path can be a discontinuous path, comprising segments of linear and/or curvlinear traverses across portions of the wafer surface. FIGS. 3A and 3B show that pad 140 is connected to a generic robotic-type mechanism 350. The mechanism includes a telescopic arm 352 which can be rotated about axis 354. The mechanism 350 can be operated to carry pad 140 along any arbitrary traversal path across wafer 10. The traversal path preferably includes a point where its separation from the wafer axis 120 is substantially equal to the offset distance, D, as shown by path 204 in FIG. 2 and path 304 in FIGS. 3A and 3B.

The traversal path can be as simple as starting from the wafer edge, head towards the wafer axis until the offset distance is reached, and reversing the direction of the pad back toward the wafer edge. In other words, a reciprocating motion much like the read-write head of a disk drive. At the other extreme, the traversal path could wind its way across the wafer surface, about its axis so long as the offset distance is not violated; i.e., the pad axis does not come closer than the offset distance to the wafer axis.

A polishing operation in accordance with the invention will now be discussed with reference to FIGS. 1–4. First, in step 402, traverse mechanism 150 is operated to locate polishing pad 140 at a zeroed-out position. As will be made clear, the zero position of pad 140 is preferably one in which the axis of rotation 122 of the pad is coincident with the axis of rotation 120 of the wafer.

In step 404, the polishing parameters are read out of data store 192. They include: an offset distance D which specifies the separation along the y-axis 138 between wafer axis 120 and pad axis 122. There is a wafer rotational speed which specifies the number of revolutions per minute the wafer is spun during a polishing operation. There is a pad spindle speed which specifies how fast the spindle is spun during a polish operation. A downforce setting specifies the pad pressure upon the surface of the wafer. A velocity profile which, as will be explained below, controls the traversal speed of the pad during a polish operation. A pad traversal count specifies the number of passes the pad makes across the wafer surface.

The x-y translation stage is operated in step 406 to translate pad 140 in the y-direction 138 by an amount sufficient to separate axes 120 and 122 by a distance equal to pad offset distance D. Recall that the traversal path illustrated in FIG. 2 is a linear path, though in general this is not a necessary condition. However, it can be seen that the polishing operation is facilitated by translating only in the x-direction. By setting the pad axis at the offset distance and making a linear translation, there is no need to monitor for how close the pad axis 122 will approach the wafer axis 120. The linear traverse guarantees a minimum separation substantially equal to the offset distance D.

Next in step 408, stage 150 is operated to position pad 140 at or near the edge of wafer 10. The wafer and pad are then spun up to speed in step 410 based on the wafer speed and the spindle speed respectively. The pad is lowered onto process surface 12 of the wafer to apply a pressure equal to the specified downforce setting, step 412. The x-y stage then translates pad 140 in the x-direction 136, the traversal velocity being varied in accordance with the velocity profile (FIG. 5), step 414. Upon reaching the opposite edge of the wafer, pad 140 is translated in the reverse direction again following the velocity profile, although in reverse this time. This is repeated for the number of times specified by the pad traversal count. During polishing, a slurry may be applied to the process surface to facilitate the polish operation. In the case of a slurry-less pad, no slurry is used during the polishing procedure.

Figure 5:
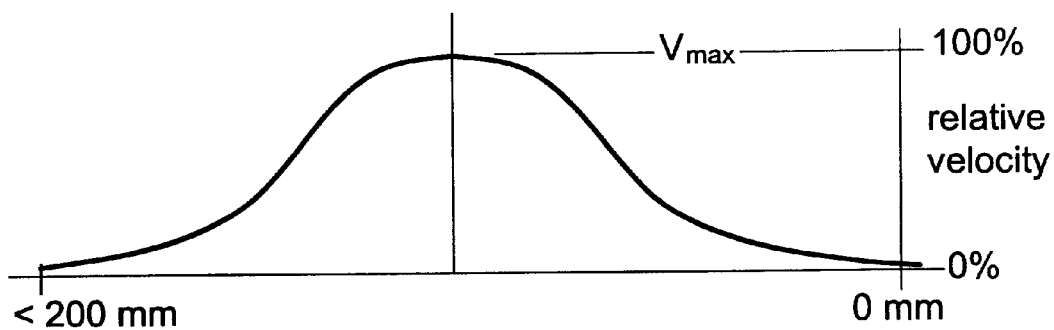
FIG. 5 is a simplified illustration of a velocity profile used with the present invention, highlighting those aspects of the velocity profile relevant to the invention.

Referring to FIG. 5, a velocity profile dictates the speed of pad translation as a function of distance from the wafer axis as the pad moves across wafer surface 12. A typical velocity profile will have a Gaussian- or bell-shaped characteristic to its curve. The horizontal axis indicates a distance from one end of the wafer. Here, the profile is for a 200 mm wafer, one end of which is marked off as "0 mm", the other end of which is marked as "<200 mm". The profile may not span the full diameter of the wafer. For example in FIG. 2, where the traversal path 204 is linear, the offset distance D positions the pad's line of traversal off the diametric center line 202. The traversal distance will be less than the diameter of the wafer in that case. Hence, the "less-than" sign notation at the 200 mm marking. In the more general case, the traversal path may wind its way about the wafer surface and thus exceed the diametric measurement of the wafer.

During a polish operation, the translational speed of pad 140 across the face of the wafer will be varied in accordance with the profile. Thus, the pad will typically have a maximum translational speed $v_{max}$ at or near the center of the wafer, with near-minimum translational speed at or near the edges of the wafer.

Figure 6A:
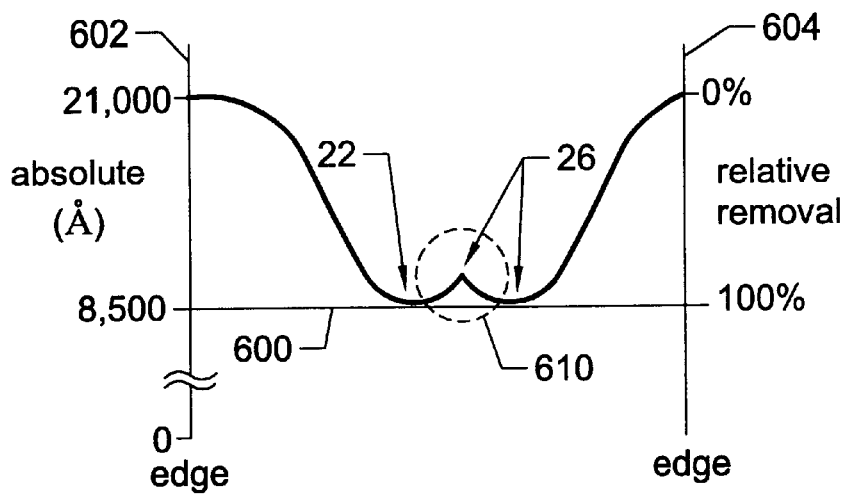
FIGS. 6A–6C are diagrammatic illustrations of typical removal profiles.
Figure 6B:
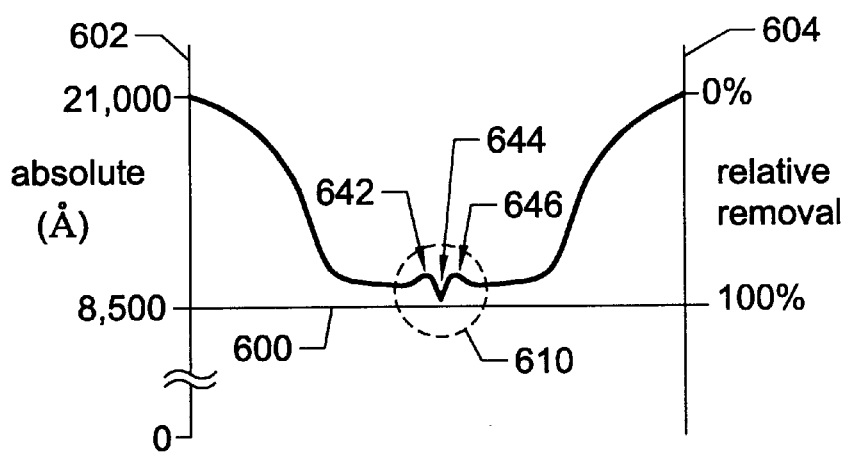
Figure 6C:
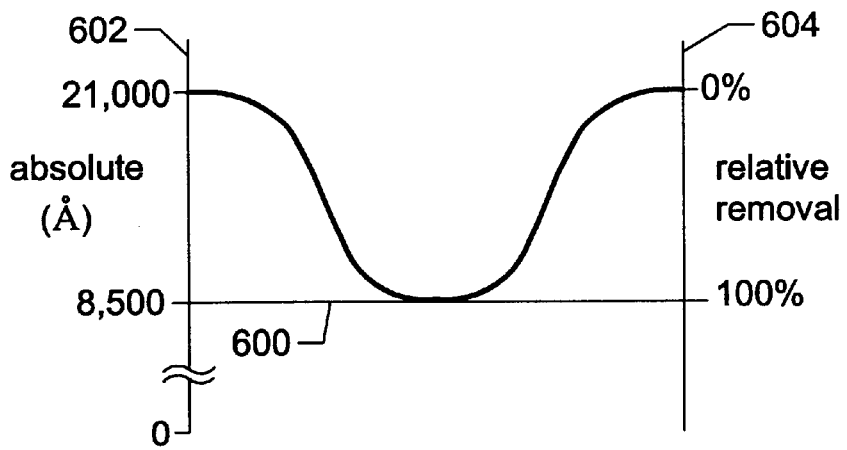

Referring to FIGS. 6A–6C, a wafer "removal profile" shows the removal pattern of material from its process surface as measured along the centerline 202 of the wafer. These figures are simplified illustrations, but nonetheless representative of, observed removal profiles, intended to facilitate the explanation of certain features of removal profiles in connection with the present invention. The horizontal scale 600 represents distance from one edge of the wafer to its diametrically opposite edge. The vertical axis indicates surface thickness of remaining film material, with the highest regions occurring at the ends of the wafer. Two vertical scales are shown: an absolute scale 602 and a relative scale 604. The absolute scale 602 shows thickness measurements for the film being removed. For example, in FIG. 6A, absolute scale 602 indicates that the low point of the wafer measures 8500 Å from some reference point indicated in the figure by a measurement of "0", and the high point is 21,000 Å from that reference point. The maximum variation in thickness is therefore 12,500 Å.

The relative scale 604 is expressed as a percentage and is computed for each removal profile. The relative scale indicates percentage of material removed from the wafer surface. During the polish, material is removed everywhere on the wafer surface. However, the relative scale normalizes the range between the maximum surface height and the minimum surface height. Thus, the surface region where the surface height is maximum represents 0% removal of material, even though some surface material had actually been removed. The surface region where the surface height is minimum represents 100% removal of material.

It was discovered that depending on the pad offset distance D of the polishing pad, the removal profile of the polished wafer will generally have the appearance of one of the three profiles shown in FIGS. 6A–6C. Typical offset distances range between 1–30 mm, depending on the pad size. If the pad offset is too small (i.e., too close to wafer axis 120), then the resulting removal profile generally resembles the profile of FIG. 6A. If the pad offset is too large, then the resulting removal profile generally resembles the profile of FIG. 6B, a multi-lobed profile. As described herein and shown in the drawings, the pad offset distance D is a nonzero offset distance.

The removal profile shows that the rate at which the material is removed during polishing varies as a function of the position of the pad along its traversal path 204, since all other parameters (including pad traversal velocity) are held constant during polishing. It can be seen in FIGS. 6A and 6B that the removal rate increases in a smooth fashion as the pad moves from either end of the wafer towards the center of the wafer. However, it has been observed that for pad offset distances which are too large or too small there is a disruption of the removal of material as the pad approaches the center of the wafer. The rate at which the surface material is removed becomes erratic. The circled regions 610 in FIGS. 6A and 6B are exemplary of typical removal disruptions that have been observed. It is believed that uniform removal of surface material in the center region is quite difficult to achieve when such removal disruptions are present. It is believed that the removal disruptions cause erratic positive and/or negative deviations of surface height to occur proximate the center of the wafer. These observed dependencies of the shapes of the removal profiles were totally unexpected and their significance in achieving a smooth polish over a substantial portion of the wafer surface heretofore unknown.

It was observed that a removal profile resembling that of FIG. 6C can be obtained by carefully controlling the pad so that the separation between the pad axis and the wafer axis does not fall below a minimum value namely, the pad offset distance. It was further observed that a high degree of uniform removal of material across the wafer's process surface can be achieved by observing the minimum offset distance and translating the pad with a velocity profile that is an inverse of the corresponding removal profile. Since the removal profile exhibits a smooth rate of removal across the entire width of the wafer, the compensation scheme discussed in connection with FIGS. 4 and 5 can achieve a highly uniform removal of surface material, especially in the center region.

Since the removal rate of material is relatively low near the edges of the wafer, the slower traversal speed of the pad provides more polishing time precisely where the additional time would be most beneficial. As the pad approaches the center where removal rate of material is increased, its traversal speed is correspondingly increased so that the center of the wafer experiences a lesser amount of polishing time. It can be seen that it is important the removal profile exhibit a smooth transition in the region about the center of the wafer. A smooth transition indicates a correspondingly smooth rate of change of the removal rate of surface material. This allows for predictably varying the speed of pad traversal to compensate for the changing rate of removal of material as the pad is translated across the wafer surface. If the transition is erratic, such as shown in the circled area 610 of FIGS. 6A and 6B, then it would be exceedingly difficult to vary the translation speed of the pad adequately to compensate for the erratic behavior. It is believed that these erratic transitions are stochastic in nature and therefore irreproducible from one wafer to the next.

A pad traversal path which violates the offset distance will result in removal disruptions, thus rendering exceedingly difficult the attainment of a uniform polish because of the erratic removal rate that results by such a deviation. In fact, it has been observed that deviations as little as 0.25 mm (i.e., 0.25 mm less than the offset distance) can cause disruption of the removal of material at the center of the wafer.

Figure 7:
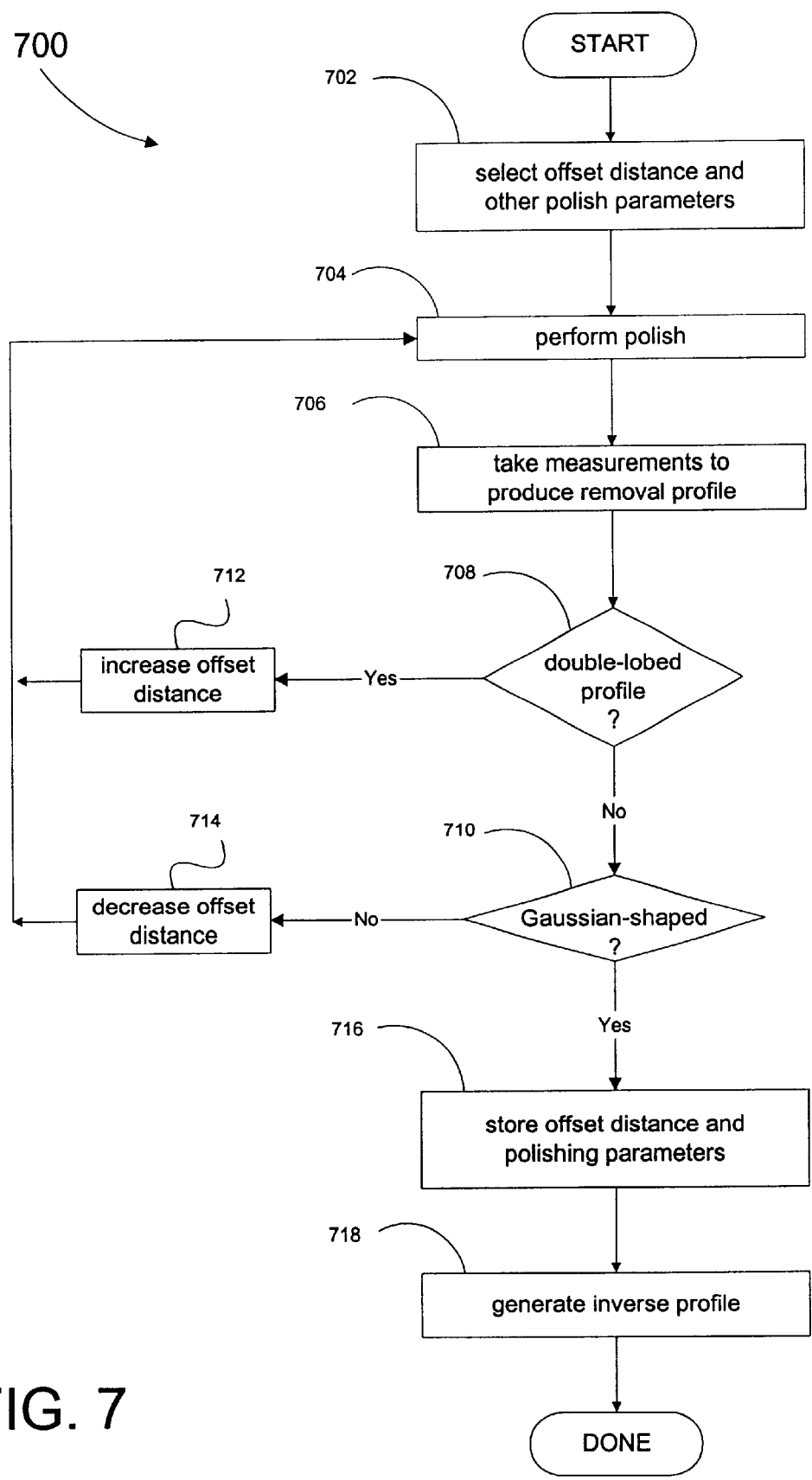
FIG. 7 is a summary of the general steps for determining an offset distance in accordance with the invention.

Referring now to FIG. 7, the general steps for obtaining the foregoing described velocity profile and the offset distance D will be described. Obtaining these parameters involves polishing a series of test wafers. The procedure involves selecting the following polishing parameters: downforce setting; wafer rotation speed; and pad spindle speed (step 702). For example, for a set of 200 mm blanket TEOS wafers, a pad with resilient backing (1.38φ) was selected. The pad was applied to the process surface with a constant downforce setting of 13 psi. The wafer was spun at a speed of 87 rpm, and the spindle speed was 787 rpm. A noteworthy observation at this point is that these settings can be dynamic rather than statically set. For example, the downforce setting can be varied as the pad is translated across the process surface. Likewise, the wafer or spindle speed can be varied during the polishing procedure.

In accordance with the invention, the translation speed of pad 140 is maintained constant for the purpose of determining the velocity profile and pad offset distance D. For the foregoing conditions, the pad traversal speed was approximately 1.5 in/sec. An initial pad offset distance $D_1$ is selected. This distance can be some value less that the pad radius, or a distance slightly off from wafer axis 120. The pad axis 122 is spaced apart from the wafer axis by an amount substantially equal to $D_1$. The wafer and pad are spun up to speed.

A polishing sequence is then initiated, step 704. This involves bringing the pad down upon the process surface proximate one end of the wafer and translating the pad across the surface at a constant velocity. Preferably, but not necessarily, the pad is translated in a linear fashion. In the preferred mode then, when the pad is linearly translated, the direction of pad translation is reversed upon reaching one end of the wafer. This is repeated for six passes for a total of twelve sweeps across wafer surface 12.

Next, in step 706, the surface height of the polished wafer taken along centerline 202 is measured to produce a removal profile. This measurement can be made with any commercially available thin film optical measurement tool. When the removal profile of the test wafer is determined the next step is to analyze the removal profile, steps 708 and 710. If the profile exhibits what is referred to herein as a double-lobed structure (FIG. 7A), then the offset distance is upwardly adjusted by an amount ≦0.25 mm, step 712. If the profile does not exhibit a Gaussian-shaped pattern (e.g., FIG. 7B), then the offset distance is decreased by an amount ≦0.25 mm, step 714.

Steps 704 through 714 are iterated for each new wafer, adjusting the pad offset each time, until a removal profile resembling the profile in FIG. 6C is obtained. At such time, the preferred offset distance $D_{pref}$ is stored along with the other polishing parameters, step 716. Next, the velocity profile is generated, step 718. The velocity profile is based on the removal profile corresponding to offset distance $D_{pref}$. More specifically, the velocity profile is the inverse of the removal profile, see FIG. 5. Thus during a polishing operation, the traversal velocity of the pad will be low near the wafer edges. Conversely, as the pad approaches the center of the wafer the velocity profile dictates that the pad traversal rate be increased.

Figure 8:
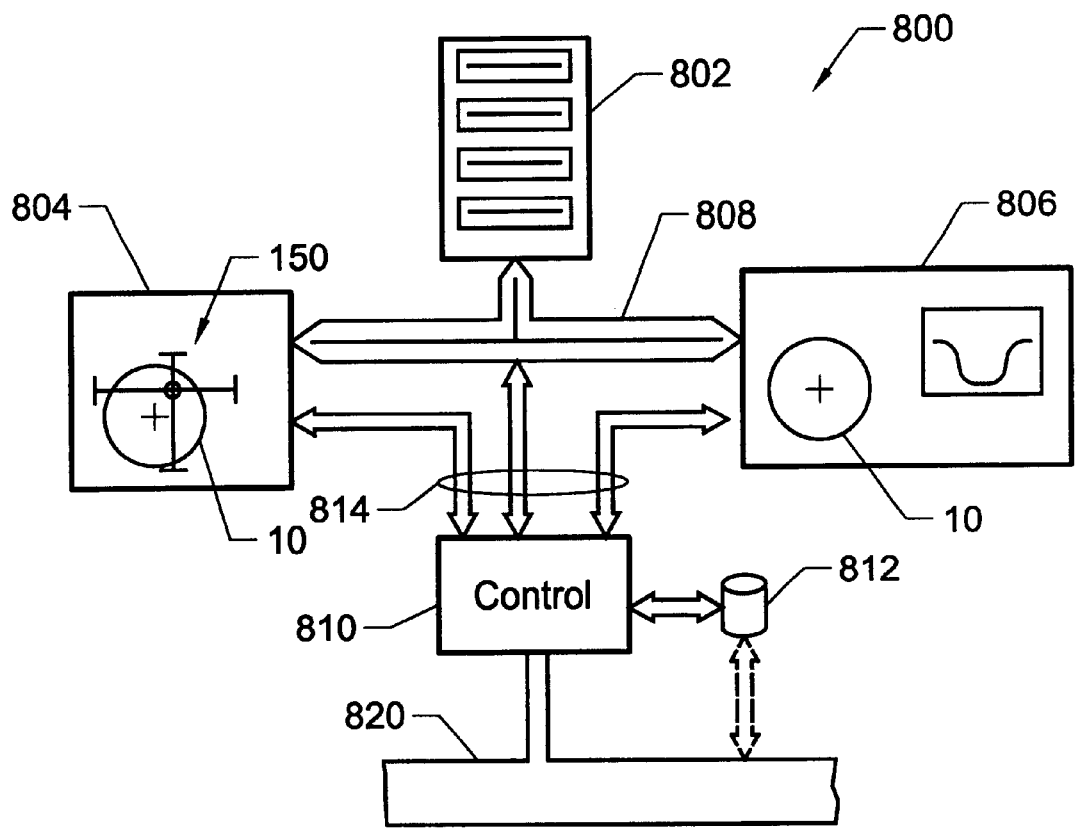
FIG. 8 is a simplified system block diagram of a CMP calibration system of the present invention.

Referring now to FIG. 8, a system 800 for a polishing apparatus in accordance with the invention will be discussed. It is noted that the figure is merely a simplified block diagram representation highlighting the components of the polishing apparatus of the present invention. The system shown is exemplary and should not unduly limit the scope of the claims herein. A person of ordinary skill in the relevant arts will recognize many variations, alternatives and modifications without departing from the scope and spirit of the invention.

Polishing system 800 includes a polishing station 804 for performing polishing operations. There is a wafer supply 802 for providing blank test wafers and for providing production wafers. A measurement station 806 is provided for making surface measurements from which the removal profiles are generated. The polishing station 804, wafer supply 802 and measurement station 806 are operatively coupled together by a robotic transport device 808. A controller 810 includes control lines and data input lines 814 which cooperatively couple together the constituent components of system 800. Controller 810 includes a data store 812 for storing at least certain user-supplied polishing parameters. Alternatively, data store 812 can be a remotely accessed data server available over a network in a local area network.

Controller 810 can be a self-contained controller having a user interface to allow a technician to interact with and control the components of system 800. For example, controller 810 can be a PC-type computer having contained therein one or more software modules for communicating with and controlling the elements of system 800. Data store 812 can be a hard drive coupled over a communication path 820, such as a data bus, for data exchange with controller 810.

In another configuration, a central controller (not shown) accesses controller 810 over communication path 820. Such a configuration might be found in a fabrication facility where a centralized controller is responsible for a variety of such controllers. Communication path 820 might be the physical layer of a local area network. As can be seen, any of a number of controller configurations is contemplated in practicing the invention. The specific embodiment will depend on considerations such as the needs of the end-user, system requirements, system costs, and the like.

The apparatus diagrammed in FIG. 8 can be operated in production mode or in calibration mode. During a production run, wafer supply 802 contains production wafers. During a calibration run, wafer supply 802 is loaded with test wafers. Measurement station 806 is used primarily during a calibration run to perform measurements on polished test wafers to produce removal profiles. However, measurement station 806 can also be used to monitor the quality of the polish operation during production runs to monitor process changes over time.

In another embodiment, measurement system 806 can be integrated into polishing station 804. This arrangement provides in situ measurement of the polishing process. As the polishing progresses, measurements can be taken. These real time measurements allow for fine tuning of the polishing parameters to provide higher degrees of uniform removal of the film material.

Figure 9:
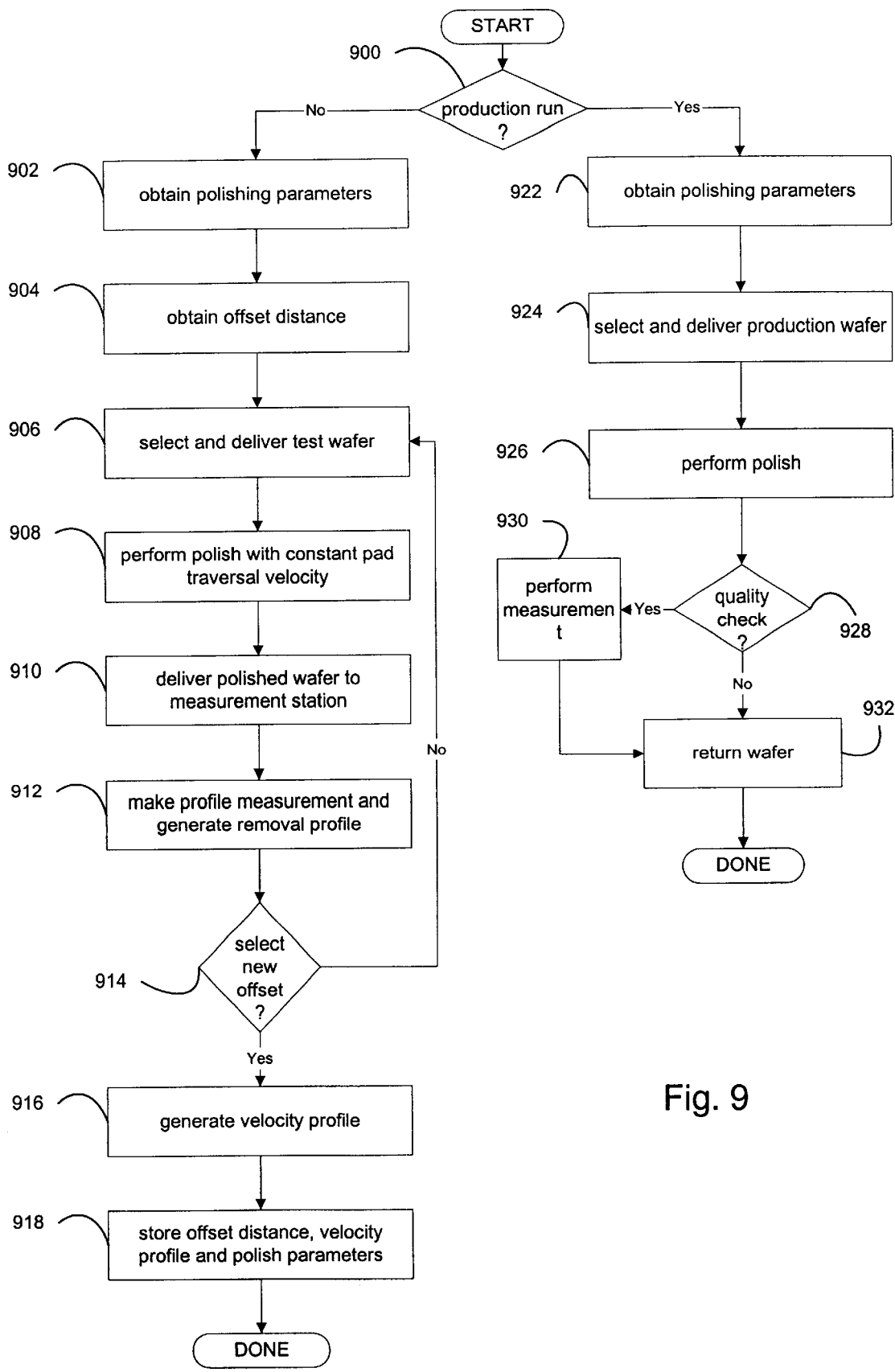
FIG. 9 is a simplified block diagram of the software components used with the CMP calibration system presented in FIG. 8.

Refer now to FIGS. 8 and 9 for a discussion of the software used in conjunction with the apparatus of FIG. 8. FIG. 9 is a function diagram highlighting the functions and processing flow provided by the software. The software is primarily resident in controller 810. However, it is understood by those skilled in the relevant arts that polishing station 804 can include control hardware (e.g., a microcontroller) and specialized control software to implement the functionality specific to the polishing function. Similarly, it is understood that measurement station 806 can include one or more microcontrollers and associated software to make the requisite measurements. The specific organization and distribution of the software components of system 800 will be dictated by factors such as available hardware and the functionality available in the components of system 800. For the purposes of the following discussion, it will be understood that the phrase "system software" (or more simply "the software") refers to the overall software which ensures cooperation among the components of system 800 to perform the described tasks, irrespective of the actual location of the software.

Continuing with FIG. 9, the system software receives an indication from a user whether to perform a production run or to make a calibration run, step 900. In the case of a calibration run, the software will first select (step 902) the polishing parameters. This can be achieved in any of a number of ways, including querying the user for such information, by using default settings, by using settings based on the wafer material, and so on. In step 904, the software selects an initial offset distance. Next, the software operates robotic device 808 to obtain a test wafer from wafer supply 802 and deliver it to polishing station 804, step 906. In step 908, a polish operation is performed in accordance with the procedure described in FIG. 7. Upon completion of the polish, the software operates the hardware to transfer the polished test wafer to measurement station 806, step 910). There, the software makes the necessary measurements on the polished wafer from which the corresponding removal profile is produced, step 912.

Based on the characteristics of the removal profile, the software determines whether to change the offset distance and repeat the procedure with a second test wafer, step 914. FIGS. 6A and 6B illustrate the presence of multiple inflection points and/or discontinuities characteristics that can be detected by the software when making its decision. For example, FIG. 6A shows a double-lobed structure 622, 624 with a discontinuity 626 occurring between the lobes. FIG. 6B shows ripple-type discontinuities 642, 644, and 646. The removal profile of FIG. 6C, however, exhibits a smooth transition with a single inflection point. These characteristics can be analyzed and readily detected using known image processing techniques.

If the removal profile indicates an adjustment of the offset distance is required, then a second offset distance is selected. This is done in accordance with the procedure described above in connection with the steps of FIG. 7. Processing then continues with step 906. Otherwise, processing proceeds to step 916 where the velocity profile is determined from the removal profile. In step 918, all the polishing parameters are stored in data store 812, including the offset distance and the velocity profile.

Returning to decision step 900, if a production run is selected, then processing proceeds to step 922 where the software reads out the polishing parameters from data store 812. In step 924, the software operates robotic device 808 to retrieve a production wafer from wafer supply 802 and deliver it to polishing station 804. The software then controls the polishing station to perform a polish operation in accordance with the polish parameters, step 926. The polishing operation proceeds in the manner discussed above in connection with the steps of FIG. 4.

Upon completion of the polish, a decision is made whether to make a quality check. This can be specified by the user or automatically performed. The quality check can be made for each wafer, on a random sampling basis, and so on. If a quality measurement is to be performed, the software operates robotic device 808 to transfer the polished wafer to measurement station 806 and make appropriate measurements. The measurements can be the same as for a calibration run, or they may be more or less comprehensive. The number and types of measurements will depend on the quality metrics of interest. In step 932, the wafer is returned to wafer supply 802.

The program code constituting the software can be expressed in any of a number of ways. The C programming language is a commonly used language because many compilers exist for translating the high-level instructions of a C program to the corresponding machine language of the specific hardware being used. For example, some of the software may reside in a PC based processor. Other software may be resident in the underlying controlling hardware of the individual stations, e.g., polishing station 804 and measurement station 806. In such cases, the C programs would be compiled down to the machine language of the microcontrollers used in those stations.

As an alternative to the C programming language, object-oriented programming languages can be used. For example, C++ is a common object-oriented programming language. The selection of a specific programming language can be made without departing from the scope and spirit of the present invention. Rather, the selection of a particular programming language is typically dependent on the availability of a compiler for the target hardware, the availability of related software development tools, and on the preferences of the software development team.

While the above is a full description of the specific embodiments, various modifications, alternative constructions and equivalents known to those of ordinary skill in the relevant arts may be used. For example, while the description above is in terms of a semiconductor wafer, it would be possible to implement the present invention with almost any type of article having a surface or the like. Therefore, the above description and illustrations should not be taken as limiting the scope of the present invention which is defined by the appended claims.

What is claimed is:

1. A method for polishing the surface of a substrate comprising the steps of:
   providing a substrate having a surface to be polished, the substrate having a first axis of rotation;
   providing a polishing pad, the polishing pad having a second axis of rotation;
   rotating the substrate about the first axis in a first rotational direction;
   rotating a polishing pad about the second axis in a second rotational direction;
   bringing the polishing pad into contact with the surface to be polished;
   determining a nonzero offset distance; and
   translating the pad across the surface of the substrate along a traversal path to vary a distance between the first axis and the second axis, the traversal path being such that the minimum distance between the first axis and the second axis is substantially equal to the offset distance.

2. The method of claim 1 wherein the traversal path is either a linear path or a curvilinear path.

3. The method of claim 1 wherein the first and second rotational directions are opposite.

4. The method of claim 1 wherein the polishing pad is smaller in area than the surface of the substrate.

5. The method of claim 1 wherein the substrate has a removal profile and wherein the step of translating the pad includes varying the speed of translation based on the removal profile of the substrate.

6. The method of claim 5 wherein the step of varying the speed of translation includes varying the speed in a manner that produces a velocity profile that is an inverse of the removal profile of the substrate.

7. The method of claim 1 wherein the step of determining the offset distance includes:
   (a) selecting a first offset distance;
   (b) polishing a test substrate;
   (c) selecting a second offset distance based on a removal profile of the polished test substrate; and
   (d) repeating steps (a) through (c) until a target removal profile is attained.

8. The method of claim 7 wherein the step of polishing the test substrate includes a second step of translating the polishing pad across a surface of the test substrate to vary a distance between an axis of rotation of the test substrate and an axis of rotation of the pad at a constant velocity.

9. The method of claim 8 wherein the step of polishing the test substrate further includes displacing the pad along a path that is parallel to a line passing through the center of the test substrate.

10. A method for polishing a semiconductor wafer comprising:
    (a) providing a semiconductor wafer having a first surface to be polished;
    (b) providing a polishing pad having a diameter less than the diameter of the semiconductor wafer;
    (c) determining a nonzero offset distance;
    (d) contacting a rotating polishing pad with the first surface; and
    (e) translating the polishing pad across the first surface along a traversal path to vary a distance between the center of the semiconductor wafer and the center of the pad, the traversal path being such that the minimum distance between the center of the wafer and the center of the pad is substantially equal to the offset distance;
    the step of determining the offset distance including:
    (i) providing a first test wafer;
    (ii) selecting a first offset distance;
    (iii) positioning the polishing pad so that its center is separated from the center of the test wafer by an amount substantially equal to the first offset distance;
    (iv) translating the polishing pad across a first surface of the test wafer;
    (v) determining a removal profile of the test wafer; and
    (vi) based on the shape of the removal profile, selecting a second offset distance and repeating substeps (iii) through (vi) with a second test wafer.

11. The method of claim 10 wherein the traversal path is either a linear path or a curvilinear path.

12. The method of claim 10 further including rotating the wafer in a direction that is opposite to the direction of rotation of the polishing pad.

13. The method of claim 10 wherein substeps (i) through (vi) are repeated until a removal profile having a single inflection point is obtained.

14. The method of claim 10 wherein the semiconductor wafer has a removal profile and wherein step (e) includes varying the speed of translation based on the removal profile.

15. The method of claim 14 wherein the step of varying the speed of translation includes varying the speed in a manner that produces a velocity profile that is an inverse of the removal profile of the semiconductor wafer.

16. The method of claim 10 wherein substep (iv) includes translating the polishing pad to vary a distance between the center of the test wafer and the center of the pad at a constant velocity.

17. The method of claim 16 wherein substep (iv) further includes translating the polishing pad along path parallel to a line passing through the center of the test wafer.

* * * * *